United States Patent
Ingle et al.

(10) Patent No.: US 9,472,781 B2
(45) Date of Patent: Oct. 18, 2016

(54) ORGANIC OPTOELECTRONIC ELEMENT INCLUDING DIFFUSION CHANNELS

(71) Applicant: OSRAM OPTO SEMICONDUCTORS GMBH, Regensburg (DE)

(72) Inventors: Andrew Ingle, Allershausen (DE); Marc Philippens, Regensburg (DE); Tilman Schlenker, Nittendorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/431,793

(22) PCT Filed: Sep. 26, 2013

(86) PCT No.: PCT/EP2013/070088
§ 371 (c)(1),
(2) Date: Mar. 27, 2015

(87) PCT Pub. No.: WO2014/049065
PCT Pub. Date: Apr. 3, 2014

(65) Prior Publication Data
US 2015/0270509 A1    Sep. 24, 2015

(30) Foreign Application Priority Data
Sep. 28, 2012 (DE) .......... 10 2012 109 207

(51) Int. Cl.
*H01L 21/00*    (2006.01)
*H01L 51/52*    (2006.01)
*H01L 51/56*    (2006.01)

(52) U.S. Cl.
CPC .......... *H01L 51/5253* (2013.01); *H01L 51/56* (2013.01); *H01L 2251/568* (2013.01); *Y10T 29/41* (2015.01)

(58) Field of Classification Search
CPC .... H01L 51/5253; H01L 51/56; H01L 51/52
USPC ......................................................... 438/26
See application file for complete search history.

(56) References Cited

U.S. PATENT DOCUMENTS

2005/0285521 A1* 12/2005 Menda ................ H01L 51/5253
313/512
2008/0149924 A1    6/2008 Aitken et al.
(Continued)

FOREIGN PATENT DOCUMENTS

CN    1934700 A    3/2007
CN    101518151 A    8/2009
(Continued)

OTHER PUBLICATIONS

German Search Report based on Application No. 10 2012 109 207.9(5 Pages) dated Jul. 16, 2013.
(Continued)

*Primary Examiner* — Matthew Gordon
(74) *Attorney, Agent, or Firm* — Viering, Jentschura & Partner mbB (57) ABSTRACT

Various embodiments may relate to a method for producing an optoelectronic component. The method may include providing an optoelectronic component comprising a dielectric layer on or above an electrically conductive layer, wherein the dielectric layer is designed for sealing the electrically conductive layer substantially hermetically impermeably with regard to water, wherein the dielectric layer has diffusion channels, and closely closing the dielectric layer, wherein at least some of the diffusion channels in the dielectric layer are closed.

15 Claims, 2 Drawing Sheets

(56) References Cited

U.S. PATENT DOCUMENTS

2008/0237872 A1* 10/2008 Nagayama .............. H01L 22/34
                                                              257/773
2012/0028011 A1   2/2012 An et al.

FOREIGN PATENT DOCUMENTS

| CN | 102057750 A | 5/2011 |
| DE | 102005050561 A1 | 4/2007 |
| JP | 2007115681 A | 5/2007 |
| KR | 20070000433 A | 1/2007 |
| WO | 2008057045 A1 | 5/2008 |
| WO | 2009126115 A1 | 10/2009 |
| WO | 2012018487 A1 | 2/2012 |

OTHER PUBLICATIONS

Korean Office Action based on Application No. 10-2015-7010966 (5 Pages and 5 pages of English translation) dated Mar. 31, 2016.
Chinese Office Action based on Application No. 201380049688.6(5 pages of English translation) dated Mar. 2, 2016.

* cited by examiner

ORGANIC OPTOELECTRONIC ELEMENT INCLUDING DIFFUSION CHANNELS

RELATED APPLICATIONS

The present application is a national stage entry according to 35 U.S.C. §371 of PCT application No.: PCT/EP2013/070088 filed on Sep. 26, 2013, which claims priority from German application No.: 10 2012 109 207.9 filed on Sep. 28, 2012, and is incorporated herein by reference in its entirety.

TECHNICAL FIELD

In various embodiments, a method and an apparatus for producing an optoelectronic component are provided.

BACKGROUND

An organic optoelectronic component, for example an OLED, may include an anode and a cathode with an organic functional layer system therebetween. The organic functional layer system may include one or a plurality of emitter layer/s in which electromagnetic radiation is generated, for example, one or a plurality of charge generating layer structure(s) each composed of two or more charge generating layers (CGL) for charge generation, and one or a plurality of electron blocking layer(s), also designated as hole transport layer(s) (HTL), and one or a plurality of hole blocking layer(s), also designated as electron transport layer(s) (ETL), in order to direct the current flow.

Optoelectronic components on an organic basis, for example organic light emitting diodes (OLEDs), are being increasingly widely used and can be used for the illumination of surfaces. In this case, a surface can be understood for example as a table, a wall or a floor. However, the organic constituents of organic components, for example of organic optoelectronic components, can often be susceptible with regard to harmful environmental influences.

A harmful environmental influence can be understood to mean all influences which can potentially lead to degradation or aging, for example a crosslinked state or crystallization, of organic substances or substance mixtures and may thus limit the operating period of organic components.

A harmful environmental influence can be for example a substance harmful to organic substances or substance mixtures, for example oxygen and/or for example a solvent, for example, water.

For protection against harmful environmental influences, the organic component is encapsulated. During the encapsulation, the organic component is surrounded with an encapsulation layer that is impermeable to harmful environmental influences, for example a thin film that is impermeable to water and oxygen.

The encapsulation layer for thin-film-encapsulated organic, optoelectronic component, for example organic light emitting diodes, as far as possible, should be free of defects. Even a microscopic defect or a diffusion channel along a grain boundary in said encapsulation layer can lead to a defect of the entire OLED. In this case, non-luminous, circular points (black spot) can form in the field of view of the OLED by means of the action of moisture and can grow over the course of time.

In the course of encapsulation, however, the situation in which defects are still located in the encapsulation layer cannot be completely ruled out. In order that the damage for the OLED is kept small, in one conventional method a glass cover is laminated onto the encapsulation layer by means of an epoxy resin adhesive.

The rate at which water diffuses into the optoelectronic component can be reduced by means of the glass cover, such that for example a defect in the encapsulation layer of an OLED is significantly slowed down as it leads to a visible defect in the OLED.

In another conventional method, a glass cover can be applied to the encapsulation layer, for example by means of frit bonding (glass frit bonding/glass soldering/seal glass bonding) by means of a conventional glass solder in the geometrical edge regions of the organic optoelectronic component.

SUMMARY

In various embodiments, a method and an apparatus for producing an optoelectronic component are provided which make it possible to improve the quality of the thin-film encapsulation of the optoelectronic component, for example of an optoelectronic component, to an extent such that defect-free optoelectronic components can be formed and early failures on account of moisture damage can thus be ruled out.

In the context of this description, a diffusion channel in a layer can be understood as a cavity in the layer having at least two openings, for example as a hole, a pore, an interconnect or the like. A diffusion channel can be embodied in the layer for example in such a way that different sides of the layer are connected to one another by the diffusion channel. A substance or substance mixture can migrate or diffuse through the diffusion channel from one opening of the diffusion channel to the at least one second opening of the diffusion channel, for example by means of an osmotic pressure or electrophoretically.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example. A substance class should be understood to mean a substance or a substance mixture including one or more organic substance(s), one or more inorganic substance(s) or one or more hybrid substance(s). The term "material" can be used synonymously with the term "substance".

In the context of this description, a first substance or a first substance mixture can be identical to a second substance or a second substance mixture, respectively, if the chemical and physical properties of the first substance or first substance mixture are identical to the chemical and physical properties of the second substance or of the second substance mixture, respectively.

In the context of this description, a first substance or a first substance mixture can be similar to a second substance or a second substance mixture, respectively, if the first substance or the first substance mixture and the second substance or the second substance mixture, respectively, have an approximately identical stoichiometric composition, approximately identical chemical properties and/or approximately identical physical properties with regard to at least one variable, for example the density, the refractive index, the chemical resistance or the like.

In this respect, by way of example, with regard to the stoichiometric composition, crystalline $SiO_2$ (quartz) can be regarded as identical to amorphous $SiO_2$ (silica glass) and as similar to $SiO_x$. However, with regard to the refractive index, crystalline $SiO_2$ can be different than $SiO_x$ or amorphous $SiO_2$. By means of the addition of additives, for example in the form of dopings, by way of example, amorphous $SiO_2$ can have a refractive index which is identical or similar to that of crystalline $SiO_2$, but can then be different than crystalline $SiO_2$ with regard to the chemical composition.

The reference variable in terms of which a first substance is similar to a second substance can be indicated explicitly or become apparent from the context, for example from the common properties of a group of substances or substance mixtures.

In the context of this description, an electrically charged substance can be understood to mean a substance which has an electrical charge, i.e. at least temporarily—is not electrically neutral. In this case, the electrical charge can be formed by means of polarization or ionization. The electrically charged substance can be embodied for example in the form of particles or molecules.

In the context of this description, an electrical potential can be understood to mean the position of an electrical charge, for example of an electrically charged substance, with regard to oppositely electrically charged electrodes. For example as electrical potential of a sample charge in an electric field (E-field) depending on the charge of the sample charge and the position in the E-field.

In the context of this description, chemical conversion can be understood to mean forming a second substance or a second substance mixture from a first substance or a first substance mixture. The chemical conversion can be carried out as a chemical oxidation and/or a chemical reduction of the first substance or of the first substance mixture. A simultaneous oxidation and reduction can be understood as a redox reaction.

In the context of this description, a chemically active substance can chemically oxidize or chemically reduce a different substance and/or itself be chemically oxidized or chemically reduced. A chemically active substance can be for example an electrically charged substance which is chemically oxidized or reduced at an electrode, for example galvanically or electrolytically.

In the context of this description, a substance hermetically impermeable with regard to water or a hermetically impermeable substance mixture may include or be formed from a ceramic, a metal and/or a metal oxide. No water can diffuse or migrate through a hermetically impermeable substance or a hermetically impermeable substance mixture.

In the context of this description, an electronic component can be understood to mean a component which concerns the control, regulation or amplification of an electric current, for example by means of the use of semiconductor components. An electronic component may include a component from the group of the following components: for example a diode, a transistor, a thermogenerator, an integrated circuits, a thyristor.

In the context of this description, an optoelectronic component can be understood to mean an embodiment of an electronic component, wherein the optoelectronic component includes an optically active region. The optically active region can absorb electromagnetic radiation and form a photocurrent therefrom or can emit electromagnetic radiation by means of a voltage applied to the optically active region. An organic optoelectronic component may include, in the optically active region, an organic substance or an organic substance mixture which is designed for example for taking up or providing electromagnetic radiation.

In the context of this description, a harmful environmental influence can be understood to mean all influences which can potentially result in degradation or aging of organic substance or organic substance mixtures and can thus limit the operating period of organic components.

A harmful environmental influence can be for example a substance which is harmful to organic substances or organic substance mixtures, for example oxygen and/or for example a solvent, for example water.

A harmful environmental influence can be for example surroundings which are harmful to organic substances or organic substance mixtures, for example a change above or below a critical value, for example of the temperature, and/or a change in the ambient pressure, as a result of which the crosslinked state, degradation and/or crystallization or the like can occur.

The connection of a first body to a second body can be positively locking, force locking and/or cohesive. The connections can be embodied as releasable, i.e. reversible. In various configurations, a reversible, close connection can be realized for example as a screw connection, a hook and loop fastener, a clamping/a use of clips.

However, the connections can also be embodied as non-releasable, i.e. irreversible. In this case, a non-releasable connection can be separated only by means of the connection means being destroyed. In various configurations, an irreversible, close connection can be realized for example as a riveted connection, an adhesively bonded connection or a soldered connection.

In the case of a positively locking connection, the movement of the first body can be restricted by a surface of the second body, wherein the first body moves perpendicularly, i.e. normally, in the direction of the restricting surface of the second body. A pin (first body) in a blind hole (second body) can be restricted in movement for example in five of the six spatial directions. In various configurations, a positively locking connection can be realized for example as a screw connection, a hook and loop fastener, a clamp/a use of clips.

In the case of a force-locking connection, in addition to the normal force of the first body on the second body, i.e. a physical contact of the two bodies under pressure, a static friction can restrict a movement of the first body parallel to the second body. One example of a force-locking connection may be, for example, the self-locking of a screw in a complementarily shaped thread. In this case, self-locking can be understood to mean a resistance by means of friction. In various configurations, a force-locking connection can be realized for example as a screw connection, a riveted joint.

In the case of a cohesive connection, the first body can be connected to the second body by means of atomic and/or molecular forces. Cohesive connections can often be non-releasable connections. In various configurations, a cohesive connection can be realized for example as an adhesively bonded connection, a solder connection, for example of a glass solder, or of a metal solder, a welded connection.

In various embodiments, a method for producing an optoelectronic component is, the method including: providing an optoelectronic component including a dielectric layer on or above an electrically conductive layer, wherein the dielectric layer is designed for sealing the electrically conductive layer substantially hermetically impermeably with regard to water, wherein the dielectric layer has diffusion channels; and closely closing the dielectric layer, wherein at least some of the diffusion channels in the dielectric layer are closed.

In one configuration of the method, the diffusion channels can be closely closed by means of a chemically active substance or a chemically active substance mixture.

In one configuration of the method, the dielectric layer can be surrounded with the chemically active substance or the chemically active substance mixture for the purpose of being closely closed. The dielectric layer can be surrounded for example completely or only partly with the chemically active substance or the chemically active substance mixture, for example by virtue of at least one part of the dielectric layer not being surrounded by the chemically active substance or the chemically active substance mixture, for example by virtue of the chemically active substance or the chemically active substance mixture being chemically structured.

In one configuration of the method, the surrounding can be embodied as temporary or permanent. Temporary surrounding can be for example as immersion of the dielectric layer into a solution, suspension or dispersion, wherein the dielectric layer is removed from the solution, suspension or dispersion after the method. Permanent surrounding can be realized for example as forming a cohesive layer on or above the dielectric layer.

In one configuration of the method, the chemically active substance or the chemically active substance mixture can be dissolved in a solution, suspension or dispersion.

In one configuration of the method, the chemically active solution, the suspension or the dispersion can be designed to be anhydrous, for example may include or be formed from propylene carbonate, sodium percarbonate, a quinone or a quinoline.

In one configuration of the method, the chemically active substance or the chemically active substance mixture can be provided in an electrolyte solution or a plating bath that surrounds the dielectric layer.

In one configuration of the method, an electrolyte solution or a plating bath can have a proportion by mass of chemically active substance or chemically active substance mixture relative to the mass of the solution in a range of approximately 1% to approximately 70%.

In one configuration of the method, the chemically active substance or the chemically active substance mixture can be formed, for example applied or deposited, on or above the dielectric layer.

In one configuration of the method, the chemically active substance or the chemically active substance mixture can be formed as a chemically active layer or in a chemically active layer on or above the dielectric layer.

In one configuration, the chemically active layer can have a thickness in a range of approximately 100 nm to approximately 20 µm, for example in a range of approximately 200 nm to approximately 5 µm.

In one configuration of the method, the chemically active layer can be designed as a chemically active paste or a chemically active coating.

In one configuration of the method, the chemically active paste may include further, volatile constituents, for example a solvent or binder, in addition to the chemically active substance or the chemically active substance mixture. The volatile constituents can still be contained in the chemically active layer on or above the dielectric layer, or else not contained; for example, the chemically active paste can be dried for the electrolysis, plating and/or electrophoresis.

In one configuration of the method, at least one part of the chemically active substance or of the chemically active substance mixture can be designed to be electrically conductive.

In one configuration of the method, the chemically active substance or the chemically active substance mixture can be electrically charged, for example can have or provide ions.

In one configuration of the method, the chemically active substance or the chemically active substance mixture may include or be formed from a metal, for example copper.

In one configuration of the method, the chemically active substance or the chemically active substance mixture may include or be formed from an oxidizing agent or a reducing agent, for example may include or be formed from propylene carbonate, sodium percarbonate, quinone or quinoline, for example may include a derivative thereof.

In one configuration of the method, the solution, suspension, dispersion or layer including chemically active substance or chemically active substance mixture, for example the oxidizing agent, can be designed to be free of water and/or hydroxide groups, i.e. can be hydroxide-free, for example may include an organic solvent.

In one configuration of the method, the method may include forming an electrical potential difference across the dielectric layer, such that an electric field is formed in the diffusion channels.

A diffusion channel can have for example a diameter in a range of from approximately the diameter of a water molecule to approximately a few nm. A diffusion channel in the dielectric layer can be or can be formed by, for example, defects, grain boundaries or the like in the dielectric layer. In various configurations, a dielectric layer can be a layer in an optoelectronic component which is embodied in a dielectric fashion and has diffusion channels described, for example a barrier thin-film layer, barrier layer, encapsulation layer, encapsulation thin-film layer, adhesive layer, getter layer, optical coupling-in layer or coupling-out layer, scattering layer, phosphor layer, colorant layer or the like.

In one configuration of the method, the electric field can be formed in such a way that an electrically charged chemically active substance or an electrically charged chemically active substance mixture migrates into the diffusion channels, for example electrophoretically, for example by virtue of a chemically active substance or a chemically active substance mixture being electrically charged by means of the electric field, for example electrolytically.

In one configuration of the method, forming the electric field may include applying an electrical potential difference across the dielectric layer.

In one configuration of the method, the electrical potential difference can be formed by means of a voltage source, wherein the voltage source has a first electrode and a second electrode, wherein the electrical potential difference is formed between the first electrode and the second electrode.

The electrical potential difference can have a magnitude of at least greater than approximately the decomposition voltage of the chemically active substance or of the chemically active substance mixture on or above the dielectric layer, for example of the substance or of the substance mixture of the electrically conductive layer or of the paste or coating on or above the dielectric layer, to approximately the decomposition voltage of the substance or of the substance mixture of the dielectric layer or of the solvent of the chemically active substance or of the chemically active substance mixture or the breakdown voltage of the substance or of the substance mixture of the dielectric layer.

In one configuration of the method, the electrical potential difference can have a magnitude in a range of approximately 0.1 V to approximately 25 V.

In one configuration of the method, the maximum magnitude of the electrical voltage profile can have a magnitude in a range of approximately 0.1 V to 5 V.

The maximum magnitude of the electrical voltage profile can also be designated as peak voltage and/or voltage amplitude, wherein the maximum magnitude of the electrical voltage profile can be temporally modulated.

In one configuration of the method, the magnitude of the voltage of the electrical voltage profile can be temporally modulated.

In one configuration of the method, the electrical voltage profile can have one of the following temporal modulations: sinusoidal, cosinusoidal, sawtooth-shaped, triangular, rectangular, pulsed.

An electrical voltage pulse can have for example one of the following voltage profiles: Gauβ, Lorentz, Voigt, Gumbel, Laplace, Lévy, Rayleigh, Rossi, Student t-profile or the like.

In one configuration of the method, an electrical voltage pulse can have a half-life and/or a pulse duration in a range of approximately 1 µs to approximately 5 s.

In one configuration of the method, the voltage profile can have an individual voltage pulse or a frequency in a range of approximately 1 Hz to approximately 1 MHz.

In one configuration of the method, the temporal modulation may include a pulse width modulation.

In one configuration of the method, the temporal modulation of the voltage profile can be correlated and/or coupled with a measured electrical conductivity of the dielectric layer and/or a measured electric current through the dielectric layer, for example by virtue of the electrical conductivity or electric current of the apparatus being measured after or during a voltage pulse.

In one configuration of the method, the peak voltage of a voltage pulse and/or the number of voltage pulses can be a function of the electrical conductivity and/or of the electric current through the dielectric layer, for example of the thickness of the non-removed dielectric layer in the current path.

The concrete magnitude of the electrical voltage can be dependent on the thickness of the dielectric layer and the dielectric properties of the substance or of the substance mixture of the dielectric layer. However, the dielectric layer should have a maximum thickness, such that the maximum magnitude of the voltage is maximally of a value such that further layers which are in electrical contact with the electrical layer structure are not damaged by means of the voltage.

In one configuration of the method, the first electrode of the voltage source can be electrically connected to the electrically conductive layer, for example closely, for example electromechanically, for example by means of a contact pin or a clamping contact; for example cohesively, for example by means of soldering or adhesive bonding.

In one configuration of the method, the electrical connection can be embodied closely, for example cohesively.

In one configuration of the method, the electrical connection can be designed to be temporary and/or reversible. A temporary and reversible electrical connection can be realized for example as the formation of a physical contact of contact pins with the electrically conductive layer and/or the chemically active substance or the chemically active substance mixture, for example contacting of the surface of the electrical layer structure with contact pins of a voltage source or immersion of an electrode of the voltage source in a solution, suspension or dispersion of a liquid, chemically active substance or chemically active substance mixture. A contact pin can also be designated as a pin.

In the context of this description, the chemically active substance or the chemically active substance mixture on or above the dielectric layer on or above the electrically conductive layer can be designated as an electrical layer structure.

In one configuration of the method, the electrical connection can be designed in such a way that the electrical circuit of the electrical connection is closed by the electrical layer structure.

In one configuration of the method, the second electrode can be electrically connected to a third electrode, for example closely, for example electromechanically, for example by means of a contact pin or a clamping contact; for example cohesively, for example by means of soldering or adhesive bonding.

In one configuration of the method, the third electrode may include or be formed from an electrically conductive, chemically active substance or an electrically conductive, chemically active substance mixture, for example on or above the dielectric layer as an electrically conductive coating or an electrically conductive paste; or for example as an electrode in a plating bath.

In one configuration of the method, the third electrode can be established in a solution, suspension or dispersion in which the chemically active substance or the chemically active substance mixture is dissolved, for example during electrophoresis.

In one configuration of the method, the chemically active substance or the chemically active substance mixture in the diffusion channels and/or on the sides of the diffusion channels, for example on the surface of the electrically conductive layer, can form a substance or a substance mixture which has no or only low solubility with regard to water, for example less than or approximately equal to the substance or substance mixture of the dielectric layer; for example, the substance formed or the substance mixture formed may include a metal, a metal oxide, for example glass; and/or a ceramic, for example aluminum oxide or copper oxide.

In one configuration of the method, the substance or the substance mixture which is formed by the chemically active substance or the chemically active substance mixture in the diffusion channel can close the diffusion channel cohesively, in a positively locking manner and/or in a force-locking manner.

In the context of this description, closing a diffusion channel can also be designated or understood as plugging, encapsulating, burying, hermetically closing, sealing or blocking a diffusion channel.

In one configuration of the method, the close connection can be embodied as insoluble with regard to water, for example as a hermetically impermeable, cohesive connection, for example by means of a metal oxide, for example a metal oxide plug.

In the context of this description, a plug can also be designated or understood as a closure, peg, stopper, bar, cap or a barrier.

In one configuration of the method, the substance or the substance mixture of the plug in the diffusion channel may include a substance the same as or similar to the dielectric view or a substance mixture the same as or similar to the dielectric view. A similar substance or a similar substance mixture can be for example a different stoichiometric composition of identical elements. By way of example, the electrically conductive layer may include or be formed from aluminum, and the dielectric layer may include or be formed from aluminum oxide. In the diffusion channel or at an opening of the diffusion channel, for example, aluminum of the electrically conductive layer can be oxidized, i.e. anodized, by means of a chemically active substance, for example an oxidizing agent, to form an aluminum oxide plug.

In one configuration of the method, the chemically active substance or the chemically active substance mixture can chemically convert, for example chemically oxidize or chemically reduce, the substance or the substance mixture of the electrically conductive layer, for example form a metal oxide layer in the case of an electrically conductive layer composed of a metal.

In other words: the chemically active substance or the chemically active substance mixture can migrate into the diffusion channels.

In one configuration of the method, a part of the substance or of the substance mixture of the electrically conductive layer on at least one side of a diffusion channel can be converted by the chemically active substance or the chemically active substance mixture. In other words: a part of the substance or of the substance mixture of the electrically conductive layer can be converted by the chemically active substance or the chemically active substance mixture upon entering a diffusion channel and/or upon emerging from a diffusion channel, for example on the wall of the diffusion channel and/or on the surface of the chemically active substance or of the chemically active substance mixture.

In other words: the substance or the substance mixture of the electrically conductive layer can migrate into the diffusion channel, and for example transform or be converted in the diffusion channel.

In one configuration of the method, the chemically active substance or the chemically active substance mixture on at least one side of a diffusion channel can be chemically converted. In other words: a part of the chemically active substance or of the chemically active substance mixture can be converted upon entering a diffusion channel and/or upon emerging from a diffusion channel, for example on the wall of the diffusion channel and/or on the surface of the electrically conductive layer.

In one configuration of the method, the electrically conductive layer may include one or a plurality of materially different, electrically conductive layers in the layer cross-section of the electrically conductive layers.

In one configuration of the method, the electrically conductive layer can be designed as an electrode, an electrical connection layer, a contact pad or the like, of the optoelectronic component.

In one configuration of the method, the chemically active substance or the chemically active substance mixture on or above the dielectric layer can be chemically activated.

In one configuration of the method, at least one second chemically active substance and/or at least one second chemically active substance mixture can be formed on or above the chemically active layer on or above the dielectric layer.

In one configuration of the method, the chemically active substance or the chemically active substance mixture on or above the dielectric layer can be chemically activated, for example ionized, only in combination with at least one further chemically active substance or chemically active substance mixture.

In one configuration of the method, the dielectric layer can be designed as an encapsulation of the electrically conductive layer, for example a barrier thin-film layer.

In one configuration of the method, the dielectric layer can have a layer thickness a thickness in a range of approximately 0.1 nm (one atomic layer) to approximately 1000 nm, for example a layer thickness of approximately 10 nm to approximately 100 nm, for example approximately 40 nm in accordance with one configuration.

In one configuration of the method, the dielectric layer may include one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof.

In one configuration of the method, the electrically conductive layer can be formed from an electrically conductive substance, such as, for example, from a metal or a transparent conductive oxide (TCO) or a layer stack of a plurality of layers of the same metal or of different metals and/or of the same TCO or of different TCOs. Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs and can be used in various exemplary embodiments. Furthermore, the TCOs do not necessarily correspond to a stoichiometric composition and can furthermore be p-doped or n-doped.

In one configuration of the method, the electrically conductive layer may include a metal; for example Ag, Pt, Au, Mg, Al, Ba, In, Ag, Au, Mg, Ca, Sm or Li, and compounds, combinations or alloys of these substances.

In one configuration of the method, the electrically conductive layer can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In one configuration of the method, the electrically conductive layer may include one or a plurality of the following substances as an alternative or in addition to the abovementioned substances: networks composed of metallic nanowires and nanoparticles, for example composed of Ag; networks composed of carbon nanotubes; graphene particles and graphene layers; networks composed of semiconducting nanowires.

In one configuration of the method, the electrically conductive layer may include electrically conductive polymers or transition metal oxides or transparent electrically conductive oxides.

In one configuration of the method, the electrically conductive layer can have a layer thickness of less than or equal to approximately 25 nm, for example a layer thickness of less than or equal to approximately 20 nm, for example a layer thickness of less than or equal to approximately 18 nm.

In one configuration of the method, the electrically conductive layer can have for example a layer thickness of greater than or equal to approximately 10 nm, for example a layer thickness of greater than or equal to approximately 15 nm.

In one configuration of the method, the electrically conductive can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

In one configuration of the method, the electrically conductive layer, for the case where the electrically conductive layer includes or is formed from a transparent conductive oxide (TCO), the electrically conductive layer can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

In one configuration of the method, the electrically conductive layer, for the case where the electrically conductive layer are formed from, for example, a network composed of metallic nanowires, for example composed of Ag, which can be combined with conductive polymers, a network composed of carbon nanotubes, which can be combined with conductive polymers, or from graphene layers and composites, the electrically conductive layer can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

In one configuration of the method, an optically and/or electrically functional layer can be formed on or above the hermetically sealed dielectric layer, for example a scattering layer, a dielectric insulation, a lacquer layer, a coupling-out layer, a coupling-in layer, a phosphor layer, a reflection layer, a heat distribution layer or the like. In other words: the method may include, after hermetic sealing, forming a further dielectric layer on or above the hermetically sealed dielectric layer.

In one configuration of the method, the optoelectronic component can be designed as an organic solar cell or an organic light emitting diode, wherein the organic light emitting diode can be designed as a bottom emitter, for example.

In various embodiments, an apparatus for producing an optoelectronic component including at least one dielectric layer on or above an electrically conductive layer is provided, wherein the dielectric layer is designed to be hermetically impermeable with regard to water and has diffusion channels, the apparatus including: an apparatus for surrounding the dielectric layer with a chemically active substance or chemically active substance mixture; a voltage source designed for providing a modulatable voltage profile, wherein the voltage source is electrically connected to the electrically conductive layer and the chemically active substance or the chemically active substance mixture in such a way that the electrical circuit is electrically closed by the diffusion channels; a control unit designed for controlling the voltage profile of the voltage source; a measuring device designed for measuring the electric current through the dielectric layer, wherein the measuring device is furthermore designed in such a way that the measured electrical conductivity is communicated to the control unit; wherein the temporal modulation of the voltage profile is coupled to the measured electric current.

In one configuration of the component apparatus, the voltage source can be designed for providing a constant DC voltage, for example have a rectifier for an electric input current.

In one configuration of the component apparatus, the measuring device can be designed for measuring the electrical resistance of the electrical layer structure, for example as a resistance bridge, for example a Wheatstone bridge or an impedance spectrometer.

In one configuration of the component apparatus, the measuring device can be designed for measuring the electrical voltage drop across the electrical layer structure, for example as a digital voltmeter.

In one configuration of the component apparatus, the measuring device can be designed for measuring the electric current through the electrical layer structure, for example as a digital ammeter.

In one configuration of the component apparatus, the control unit can be designed as a phase dimmer, wherein the control signal for phase chopping control or phase gating control is a function of the measured conductivity of the electrical layer structure.

In one configuration of the component apparatus, the control unit can be designed as a pulse modulator, for example for pulse width modulation or pulse frequency modulation, wherein the control signal for pulse modulation is a function of the measured conductivity of the electrical layer structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

Figure 1:
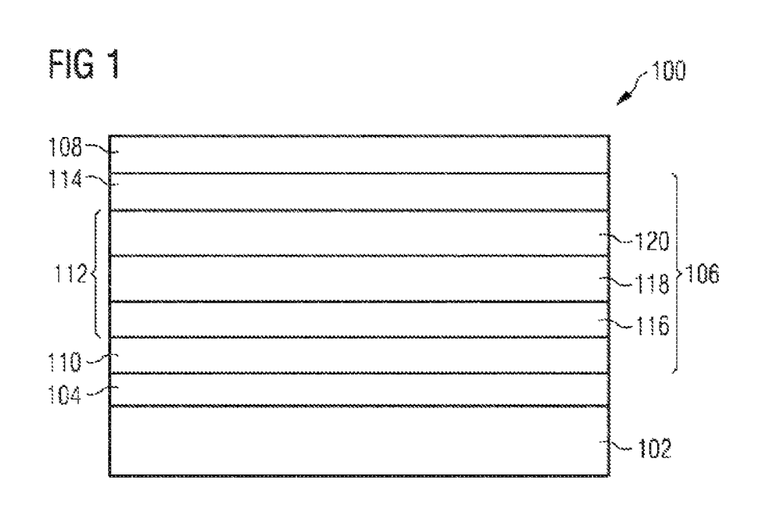
FIG. 1 shows a schematic cross-sectional view of an optoelectronic component, in accordance with various configurations.

FIG. 1 shows a schematic cross-sectional view of an optoelectronic component, in accordance with various embodiments.

The optoelectronic component 100, for example an electronic component 100 which provides electromagnetic radiation, for example a light emitting component 100, for example in the form of an organic light emitting diode 100, can have a carrier 102. The carrier 102 can serve for example as a carrier element for electronic elements or layers, for example light emitting elements. By way of example, the carrier 102 may include or be formed from glass, quartz and/or a semiconductor material or any other suitable substance. Furthermore, the carrier 102 may include or be formed from a plastics film or a laminate including one or including a plurality of plastics films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier 102 may include one or more of the substances mentioned above. The carrier 102 may include or be formed from a metal or a metal compound, for example copper, silver, gold, platinum or the like.

A carrier 102 including a metal or a metal compound can also be embodied as a metal film or a metal-coated film.

The carrier 102 can be embodied as translucent or even transparent.

In various embodiments, the term "translucent" or "translucent layer" can be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light emitting diode 100 (or else the light emitting components in accordance with the embodiments that have been described above or will be described below) can be designed as a so-called top and bottom emitter. A top and/or bottom emitter can also be designated as an optically transparent component, for example a transparent organic light emitting diode.

In various embodiments, a barrier layer 104 can optionally be arranged on or above the carrier 102. The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 106 of the light emitting component 100 can be arranged on or above the barrier layer 104. The electrically active region 106 can be understood as that region of the light emitting component 100 in which an electric current for the operation of the light emitting component 100 flows. In various embodiments, the electrically active region 106 may include a first electrode 110, a second electrode 114 and an organic functional layer structure 112, as are explained in even greater detail below.

In this regard, in various embodiments, the first electrode 110 (for example in the form of a first electrode layer 110) can be applied on or above the barrier layer 104 (or, if the barrier layer 104 is not present, on or above the carrier 102). The first electrode 110 (also designated hereinafter as bottom electrode 110) can be formed from an electrically conductive substance, such as, for example, a metal or a transparent conductive oxide (TCO) or a layer stack including a plurality of layers of the same metal or different metals and/or the same TCO or different TCOs. Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 110 may include a metal; for example Ag, Pt, Au, Mg, Al, Ba, In, Ca, Sm or Li, and compounds, combinations or alloys of these materials.

In various embodiments, the first electrode 110 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 110 may include one or a plurality of the following substances as an alternative or in addition to the abovementioned substances: networks composed of metallic nanowires and nanoparticles, for example composed of Ag; networks composed of carbon nanotubes; graphene particles and graphene layers; networks composed of semiconducting nanowires.

Furthermore, the first electrode 110 may include electrically conductive polymers or transition metal oxides or transparent electrically conductive oxides.

In various embodiments, the first electrode 110 and the carrier 102 can be formed as translucent or transparent. In the case where the first electrode 110 includes or is formed from a metal, the first electrode 110 can have for example a layer thickness of less than or equal to approximately 25 nm, for example a layer thickness of less than or equal to approximately 20 nm, for example a layer thickness of less than or equal to approximately 18 nm. Furthermore, the first electrode 110 can have for example a layer thickness of greater than or equal to approximately 10 nm, for example a layer thickness of greater than or equal to approximately 15 nm. In various embodiments, the first electrode 110 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 110 includes or is formed from a transparent conductive oxide (TCO), the first electrode 110 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 110 are formed from, for example, a network composed of metallic nanowires, for example composed of Ag, which can be combined with conductive polymers, a network composed of carbon nanotubes which can be combined with conductive polymers, or from graphene layers and composites, the first electrode 110 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 110 can be formed as an anode, that is to say as a hole-injecting electrode, or as a cathode, that is to say as an electron-injecting electrode.

The first electrode 110 can have a first electrical contact pad, to which a first electrical potential (provided by an energy source (not illustrated), for example a current source or a voltage source) can be applied. Alternatively, the first electrical potential can be applied to the carrier 102 and then be applied indirectly to the first electrode 110 via said carrier. The first electrical potential can be, for example, the ground potential or some other predefined reference potential.

Furthermore, the electrically active region 106 of the light emitting component 100 can have an organic functional layer structure 112, which is applied or formed on or above the first electrode 110.

The organic functional layer structure 112 may include one or a plurality of emitter layers 118, for example including fluorescent and/or phosphorescent emitters, and one or a plurality of hole-conducting layers 116 (also designated as hole transport layer(s) 120). In various embodiments, one or a plurality of electron-conducting layers 116 (also designated as electron transport layer(s) 116) can alternatively or additionally be provided.

Examples of emitter materials which can be used in the light emitting component 100 in accordance with various embodiments for the emitter layer(s) 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]-ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]-anthracene) and red fluorescent DCM2 (4-dicyano-methylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) 118 of the light emitting component 100 can be selected for example such that the light emitting component 100 emits white light. The emitter layer(s) 118 may include a plurality of emitter materials that emit in different colors (for example blue and yellow or blue, green and red); alternatively, the emitter layer(s) 118 can also be constructed from a plurality of partial layers, such as a blue fluorescent emitter layer 118 or blue phosphorescent emitter layer 118, a green phosphorescent emitter layer 118 and a red phosphorescent emitter layer 118. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The organic functional layer structure 112 may generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic functional layer structure 112 may include one or a plurality of electroluminescent layers embodied as a hole transport layer 120, so as to enable for example in the case of an OLED an effective hole injection into an electroluminescent layer or an electroluminescent region. Alternatively, in various embodiments, the organic functional layer structure 112 may include one or a plurality of functional layers embodied as an electron transport layer 116, so as to enable for example in an OLED an effective electron injection into an electroluminescent layer or an electroluminescent region. By way of example, tertiary amines, carbazole derivatives, conductive polyaniline or polyethylene dioxythiophene can be used as material for the hole transport layer 120. In various embodiments, the one or the plurality of electroluminescent layers can be embodied as an electroluminescent layer.

In various embodiments, the hole transport layer 120 can be applied, for example deposited, on or above the first electrode 110, and the emitter layer 118 can be applied, for example deposited, on or above the hole transport layer 120. In various embodiments, the electron transport layer 116 can be applied, for example deposited, on or above the emitter layer 118.

In various embodiments, the organic functional layer structure 112 (that is to say for example the sum of the thicknesses of hole transport layer(s) 120 and emitter layer(s) 118 and electron transport layer(s) 116) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of two, three or four OLEDs arranged directly one above another, in which case for example the organic functional layer structure 112 can have a layer thickness of a maximum of approximately 3 µm.

The light emitting component 100 may optionally generally include further organic functional layers, for example arranged on or above the one or the plurality of emitter layers 118 or on or above the electron transport layer(s) 116, which serve to further improve the functionality and thus the efficiency of the light emitting component 100.

The second electrode 114 (for example in the form of a second electrode layer 114) can be applied on or above the organic functional layer structure 112 or, if appropriate, on or above the one or the plurality of further organic functional layer structures.

In various embodiments, the second electrode 114 may include or be formed from the same substances as the first electrode 110, metals being particularly suitable in various embodiments.

In various embodiments, the second electrode 114 (for example for the case of a metallic second electrode 114) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 114 can generally be formed in a similar manner to the first electrode 110, or differently than the latter. In various embodiments, the second electrode 114 can be formed from one or more of the substances and with the respective layer thickness as described above in connection with the first electrode 110. In various embodiments, both the first electrode 110 and the second electrode 114 are formed as translucent or transparent. Consequently, the light emitting component 100 illustrated in FIG. 1 can be designed as a top and bottom emitter (to put it another way as a transparent light emitting component 100).

The second electrode 114 can be formed as an anode, that is to say as a hole-injecting electrode, or as a cathode, that is to say as an electron-injecting electrode.

The second electrode 114 can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 108, for example in the form of a barrier thin-film layer/thin-film encapsulation 108, can optionally also be formed on or above the second electrode 114 and thus on or above the electrically active region 106.

In the context of this application, a "barrier thin-film layer" 108 or a "barrier thin film" 108 can be understood to mean, for example, a layer or a layer structure which is suitable for forming a barrier against chemical impurities or atmospheric substances, in particular against water (moisture) and oxygen. In other words, the barrier thin-film layer 108 is formed in such a way that OLED-damaging substances such as water, oxygen or solvent cannot penetrate through it or at most very small proportions of said substances can penetrate through it.

In accordance with one configuration, the barrier thin-film layer 108 can be formed as an individual layer (to put it another way, as a single layer). In accordance with an alternative configuration, the barrier thin-film layer 108 may include a plurality of partial layers formed one on top of another. In other words, in accordance with one configuration, the barrier thin-film layer 108 can be formed as a layer stack. The barrier thin-film layer 108 or one or a plurality of partial layers of the barrier thin-film layer 108 can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 108 having a plurality of partial layers, all the partial layers can be formed by means of an atomic layer deposition method. A layer sequence including only ALD layers can also be designated as a "nanolaminate".

In accordance with an alternative configuration, in the case of a barrier thin-film layer 108 including a plurality of partial layers, one or a plurality of partial layers of the barrier thin-film layer 108 can be deposited by means of a different deposition method than an atomic layer deposition method, for example by means of a vapor deposition method.

In accordance with one configuration, the barrier thin-film layer 108 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 108 includes a plurality of partial layers, all the partial layers can have the same layer thickness. In accordance with another configuration, the individual partial layers of the barrier thin-film layer 108 can have different layer thicknesses. In other words, at least one of the partial layers can have a different layer thickness than one or more other partial layers.

In accordance with one configuration, the barrier thin-film layer 108 or the individual partial layers of the barrier thin-film layer 108 can be formed as a translucent or transparent layer. In other words, the barrier thin-film layer 108 (or the individual partial layers of the barrier thin-film layer 108) can consist of a translucent or transparent substance (or a substance mixture that is translucent or transparent).

In accordance with one configuration, the barrier thin-film layer 108 or (in the case of a layer stack having a plurality of partial layers) one or a plurality of the partial layers of the barrier thin-film layer 108 may include or be formed from one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 108 or (in the case of a layer stack having a plurality of partial layers) one or a plurality of the partial layers of the barrier thin-film layer 108 may include one or a plurality of high refractive index materials, to put it another way one or a plurality of materials having a high refractive index, for example having a refractive index of at least 2.

Figure 2:
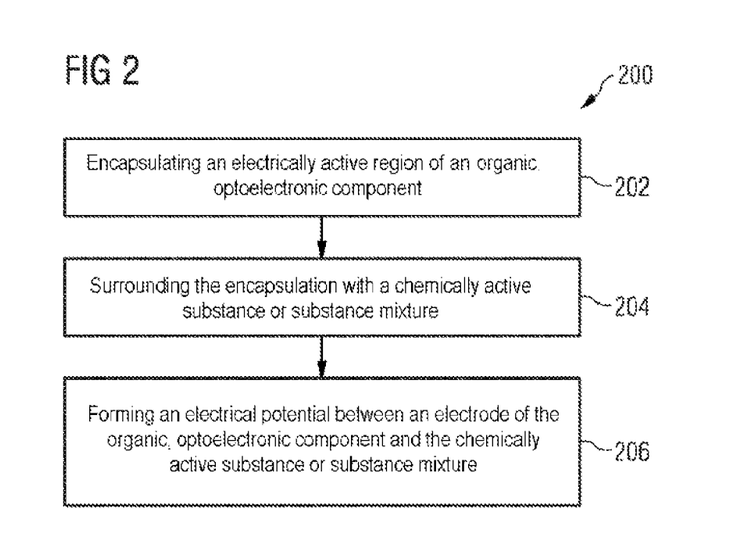
FIG. 2 shows a diagram for the method for producing an optoelectronic component, in accordance with various configurations.

FIG. 2 shows a diagram for the method for producing an optoelectronic component, in accordance with various configurations.

The method in accordance with various configurations may include encapsulating 202 an electrically active region 106 of an optoelectronic component 100 on or above a carrier 102, for example in accordance with one of the configuration from the descriptions of FIG. 1, with a barrier thin-film layer 108.

Furthermore, the method may include surrounding 204 the optoelectronic component 100 with barrier thin-film layer 108 with a chemically active substance or chemically active substance mixture.

In one configuration, surrounding 204 can be designed as forming a layer composed of a chemically active substance or chemically active substance mixture on or above the barrier thin-film layer 108.

In one configuration, surrounding 204 can be designed as wetting the barrier thin-film layer 108 with a liquid chemically active substance or chemically active substance mixture, for example immersing an optoelectronic component 100 in a solution including chemically active substance or chemically active substance mixture, wherein the barrier thin-film layer 108 is completely surrounded by the solution, i.e. wetted.

Furthermore the method may include forming 206 an electrical potential between one of the electrodes 110, 114 of the optoelectronic component 100 and the chemically active substance or the chemically active substance mixture.

In one configuration of the method, the chemically active substance or the chemically active substance mixture can be chemically activated only by means of the electrical potential, i.e. become a chemically active substance or substance mixture, for example by means of electrolysis.

Figure 3:
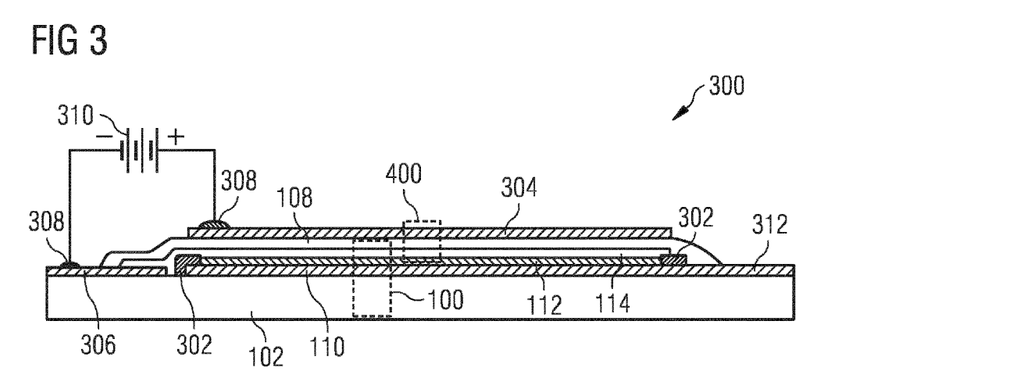
FIG. 3 shows a schematic cross-sectional view of an optoelectronic component, in accordance with various configurations.

FIG. 3 shows a schematic cross-sectional view of an optoelectronic component, in accordance with various configurations.

The illustration shows a schematic cross-sectional view of an optoelectronic component 100, for example in accordance with one of the configuration from the descriptions of FIG. 1, in the method for producing an optoelectronic component 100, for example in accordance with one configuration from the description of FIG. 2, after surrounding 204 the barrier thin-film layer 108 with a layer composed of a chemically active substance 304 or a chemically active substance mixture 304.

The illustration shows a first electrode 110 on or above a carrier 102. An organic functional layer structure 112 is formed on or above the first electrode 110. A second electrode 114 is formed on or above the organic functional layer structure 112. A barrier thin-film layer 108 is formed on or above the second electrode 114. A chemically active layer, for example a chemically active coating, a chemically active paste or the like, of a chemically active substance 304 or of a chemically active substance mixture 304 is formed and/or arranged on or above the barrier thin-film layer 108.

The illustration furthermore shows that the second electrode 114 is electrically insulated from the first electrode 110 by means of an electrical insulation 302, for example composed of polyimide.

In the region of the geometrical edge of the carrier 102 of the optoelectronic component 100, the optoelectronic component may include contact pads which are designed for making electrical contact with the organic functional layer structure 112, i.e. are electrically connected to the organic functional layer structure 112. For the second electrode 114, for this purpose a contact pad 306 can be established on or above the carrier 102. The contact pad 306 of the second electrode 114 can be electrically insulated from the first electrode 110, for example by means of the electrical insulation 302.

The electrical contact-connection of the first electrode 110 can be formed right into the geometrical edge region of the carrier 102—illustrated on the right in FIG. 3.

Forming 206 the electrical potential between an electrode the second electrode 114 in the configuration illustrated, can be effected by means of making electrical contact with the contact pad 306 and the chemically active substance 304 or the chemically active substance mixture 304 by means of electrical contacts 308, for example by means of a close connection of the electrodes of an electrical voltage source 310 to the contact pad 306 and the layer of the chemically active substance 304 or the chemically active substance mixture 304, for example by means of contact pins, clamping contacts, electrically conductive adhesive-bonding connections or a soldering connection.

The electrical potential, for example an electrical voltage profile, can be formed by means of the voltage source 310, which is electrically connected to the electrical contacts 308.

The voltage profile should be designed in such a way that the barrier thin-film layer 108 has dielectric properties, i.e. is designed to be electrically insulating.

When a maximum voltage value is exceeded, in the case of some configurations of the barrier thin-film layer 108, for example a barrier thin-film layer 108 composed of zinc oxide, the barrier thin-film layer 108 can become electrically conductive.

Figure 4:
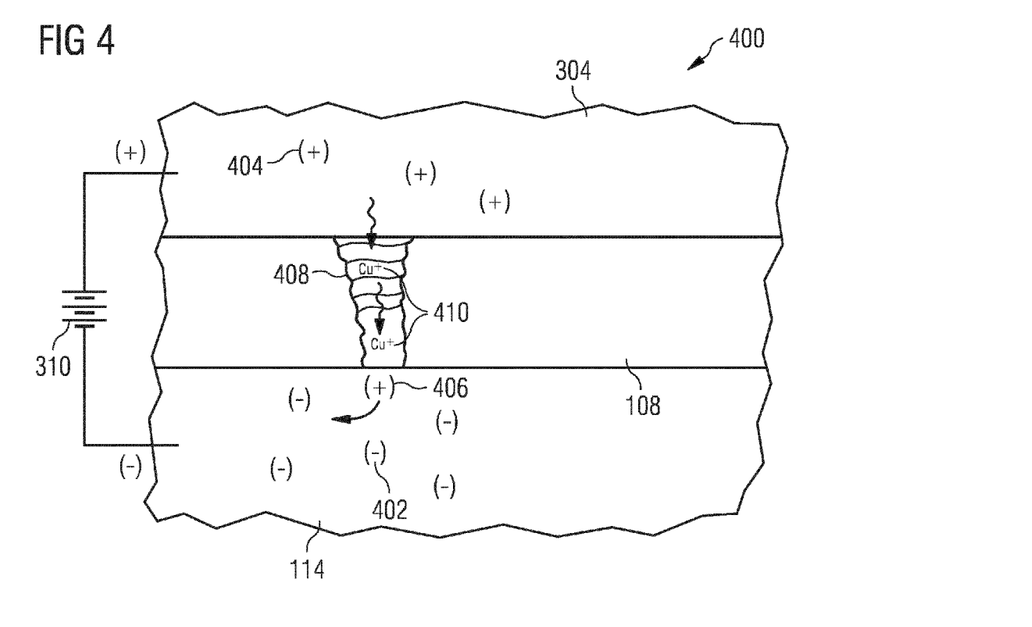
FIG. 4 shows a schematic cross-sectional view of a region of an optoelectronic component, in accordance with various configurations.

As a result, the electrical potential across the barrier thin-film layer 108 can enable an electric current flow of electrical charge carriers through the barrier thin-film layer 108, for example if the barrier thin-film layer 108 has electrically conductive channels, for example diffusion channels 408 (see FIG. 4).

The voltage profile can for example generate a DC current and/or have voltage pulses, for example be pulsed. The voltage pulses can be modulated by means of a pulse width modulation, for example.

The layers of the optoelectronic component in the excerpt 100 in view 300 are described in various embodiments in FIG. 1.

The layers of the optoelectronic component in the excerpt 400 in view 300 are described in various embodiments in FIG. 4.

FIG. 4 shows a schematic cross-sectional view of a region of an optoelectronic component, in accordance with various configurations.

The illustration shows an enlargement of the schematic cross-sectional view of one of the configuration from the descriptions of FIG. 3 with a barrier thin-film layer 108 on or above the second electrode 114. The illustration furthermore shows the layer of the chemically active substance 304 or the chemically active substance mixture 304 on or above the barrier thin-film layer 108, wherein an electrical potential is formed between the second electrode 114 and the layer of the chemically active substance 304 or the chemically active substance mixture 304 by means of the voltage source 310.

The illustration furthermore shows a diffusion channel 408 in the barrier thin-film layer 108, through which diffusion channel water could diffuse into the organic functional layer structure, for example by means of an osmotic pressure.

Forming 206 the electrical potential between the second electrode 114 and the layer of the chemically active substance 304 or the chemically active substance mixture 304 can lead to ionization of the chemically active substance 304 or the chemically active substance mixture 304.

In one configuration, the chemically active layer of the chemically active substance 304 or the chemically active substance mixture 304 may include or be formed from copper. The copper layer can be deposited, for example vapor-deposited, on the barrier thin-film layer 108, for example.

By means of the electrical potential, at least part of the copper or of the copper compound of the substance or of the substance mixture of the chemically active layer can be ionized, i.e. form freely mobile electrical charge carriers, for example freely mobile copper ions. In other words: the substance or the substance mixture of the chemically active can be chemically activated by means of the electrical potential.

By means of the electric field, for example, the freely mobile, electrically positively charged charge carriers 404 of the layer of the chemically active substance 304 or the chemically active substance mixture 304, for example electrically positively charged copper ions 404, can migrate into the diffusion channel 408—illustrated by means of the arrows 410.

The for example electrically positively charged charge carriers 404 of the chemically active substance 304 or the chemically active substance mixture 304 can thereby migrate into the second electrode 114—illustrated by means of the arrow 406.

In the second electrode 114, the electrically positively charged charge carriers 404 of the chemically active substance 304 or the chemically active substance mixture 304 can encounter electrically complementarily charged charge carriers 402, for example electrically negatively charged charge carriers 402, for example freely mobile electrons, of the second electrode 114.

A reduction of the charge carriers 404 of the chemically active substance 304 or the chemically active substance mixture 304 can occur as a result. In other words: the chemically active substance or the chemically active substance mixture can be chemically converted at the second electrode 114, for example can become chemically inactive, for example can be closely connected to the second electrode 114. Hermetic closure of the diffusion channels 408 can occur as a result.

In one configuration (not illustrated), the chemically active layer can be embodied as an electrically conductive, chemically active paste or the chemically active substance 304 or the chemically active substance mixture 304 can be distributed therein. The chemically active substance 304 or the chemically active substance mixture can be designed for example as an oxidizing agent 304, for example a source of oxygen ions, for example hydrogen peroxide. The electrical conductivity of the chemically active paste can be formed for example by means of electrically conductive additives in the chemically active paste.

Forming 206 the electrical potential between the second electrode 114 and the electrically conductive, chemically active paste may include for example electrically contact-connecting the second electrode 114 to a negative pole of the electrical voltage source 310 and contact-connecting the electrically conductive, chemically active paste to a positive pole of the electrical voltage source 310, for example by means of contact pins. The second electrode 114 may include or be formed from, for example, a metal, for example aluminum. In one configuration of the voltage profile of the electrical voltage source 310, metallic cations, for example aluminum ions, can emerge from the second electrode 114 and migrate through a diffusion channel 408. A contact of the metallic cations with the oxidizing agent 304 of the electrically conductive, chemically active paste can lead to formation of a metal oxide, for example an aluminum oxide. As a result, the metal oxide can close an opening of the diffusion channel 408.

In one configuration (not illustrated), a chemically active, electrically conductive layer, for example a metal layer, for example an aluminum layer, can be formed on or above a barrier thin-film layer 108, for example by aluminum being vapor-deposited onto or above the barrier thin-film layer 108. A paste including an oxidizing agent can be applied to or above the chemically active, electrically conductive layer. In one configuration, the paste including an oxidizing agent can be designed to be electrically conductive. After forming 206 an electrical potential between, for example, the second electrode 114 and the chemically active, electrically conductive layer, freely mobile ions of the chemically active, electrically conductive layer can be converted into an oxide derivative by means of the paste including oxidizing agent. In other words: an electrically conductive substance, for example a metal, for example aluminum, can be chemically activated by means of an electrical potential and can be converted, for example to form aluminum oxide, by a further chemically active substance, for example an oxidizing agent, in such a way that the diffusion channels 408 in the barrier thin-film layer 108 can be closed.

In one configuration (not illustrated), further electrically conductive layers, for example further metal layers, for example a titanium layer, can be formed on or above the second electrode 114, that is to say between the second electrode 114 and the barrier thin-film layer 108. Said further electrically conductive layers can form, during the anodic oxidation, for example, stable, hermetically impermeable, i.e. diffusion-impermeable, oxides in the diffusion channels 408 or on at least one side of a diffusion channel 408.

In one configuration (not illustrated), surrounding 204 the barrier thin-film layer 108 with a chemically active substance 304 or a chemically active substance mixture 304 can also be designed as introducing, for example immersing, the encapsulated optoelectronic component, i.e. with barrier thin-film layer 108, into a chemically active solution, suspension or dispersion.

In other words: the chemically active substance or the chemically active substance mixture can be dissolved in a solution or dispersion and pass as an electrolyte into the diffusion channels 408. The chemically active solution, suspension or dispersion can be for example a bath for the copper electrolysis. The chemically active substance or the chemically active substance mixture may include or be formed from, for example, metal ions, for example copper ions, which can be reduced for example at the second electrode 114, for example composed of aluminum, to form a metal, for example copper. As a result, over time, that is to say over the duration for which the electrical potential or the electric field is formed, growth of metal can build up in the diffusion channel 408, for example the diffusion channel 408 can be filled with copper during a copper electrolysis.

Instead of an aqueous electrolysis solution, which can constitute a harmful environmental influence on the optoelectronic component, it is possible to use for example a solution composed of a hydroxide-free solvent, for example propylene carbonate, a quinone or a quinoline.

In various embodiments, a method and an apparatus for producing an optoelectronic component are provided which make it possible to improve the quality of the thin-film encapsulation of the optoelectronic component. By means of applying a chemically active layer to or above the thin-film encapsulation of the optoelectronic component, for example an optoelectronic component, and applying an electric field between the cathode of the optoelectronic component and the chemically active layer, at possible defect sites of the thin-film encapsulation it is possible to initiate an electrochemical reaction which heals said defects in the thin-film encapsulation. As a result, defect-free encapsulated, electrical components, for example optoelectronic components, for example organic optoelectronic components, can be formed and early failures on account of moisture damage can be ruled out.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic component, the method comprising:
   providing an optoelectronic component comprising a dielectric layer on or above an electrically conductive layer, wherein the dielectric layer is designed for sealing the electrically conductive layer substantially hermetically impermeably with regard to water, wherein the dielectric layer has diffusion channels; and
   closing the dielectric layer, wherein at least some of the diffusion channels in the dielectric layer are closed, and wherein the diffusion channels are closed by means of forming a connection between a chemically active substance or a chemically active substance mixture in the respective diffusion channel and the dielectric layer;
   wherein the chemically active substance or the chemically active substance mixture is electrically charged.

2. The method as claimed in claim 1,
   wherein the dielectric layer is surrounded with the chemically active substance or the chemically active substance mixture for the purpose of being closed.

3. The method as claimed in claim 2,
   wherein the chemically active substance or the chemically active substance mixture is dissolved in a solution, suspension or dispersion.

4. The method as claimed in claim 3,
   wherein the chemically active solution, suspension or dispersion is designed to be anhydrous.

5. The method as claimed in claim 2,
   wherein the chemically active substance or the chemically active substance mixture is formed as a chemically active layer or in a chemically active layer on or above the dielectric layer.

6. The method as claimed in claim 1,
   wherein at least one part of the chemically active substance or of the chemically active substance mixture is designed to be electrically conductive.

7. The method as claimed in claim 1, further comprising:
   forming an electrical potential difference across the dielectric layer, such that an electric field is formed in the diffusion channels.

8. The method as claimed in claim 1,
   wherein the optoelectronic component is designed as an organic optoelectronic component.

9. The method as claimed in claim 1,
   wherein the optoelectronic component is designed as an organic solar cell or an organic light emitting diode.

10. The method as claimed in claim 1,
    wherein the chemically active substance or the chemically active substance mixture has or provides ions.

11. An apparatus for producing an optoelectronic component comprising at least one dielectric layer on or above an electrically conductive layer, wherein the dielectric layer is designed to be hermetically impermeable with regard to water and has diffusion channels, the apparatus comprising:
    an apparatus for surrounding the dielectric layer with a chemically active substance or chemically active substance mixture, wherein the chemically active substance or the chemically active substance mixture is electrically charged;

a voltage source designed for providing a modulatable voltage profile, wherein the voltage source is electrically connected to the electrically conductive layer and the chemically active substance or the chemically active substance mixture in such a way that an electrical circuit is electrically closed by the diffusion channels;

a control unit designed for controlling the voltage profile of the voltage source; and a measuring device designed for measuring the electric current through the dielectric layer, wherein the measuring device is furthermore designed in such a way that the measured electrical conductivity is communicated to the control unit; wherein the temporal modulation of the voltage profile is coupled to the measured electric current.

12. The component apparatus as claimed in claim 11, wherein the voltage source is designed for providing a constant DC voltage.

13. The component apparatus as claimed in claim 11, wherein the control unit is designed as a pulse modulator, wherein the control signal for pulse modulation is a function of the measured conductivity of the electrical layer structure.

14. The component apparatus as claimed in claim 12, wherein the voltage source has a rectifier for an electric input current.

15. The component apparatus as claimed in claim 13, wherein the pulse modulator is for pulse width modulation or pulse frequency modulation.

* * * * *